Figure 1:
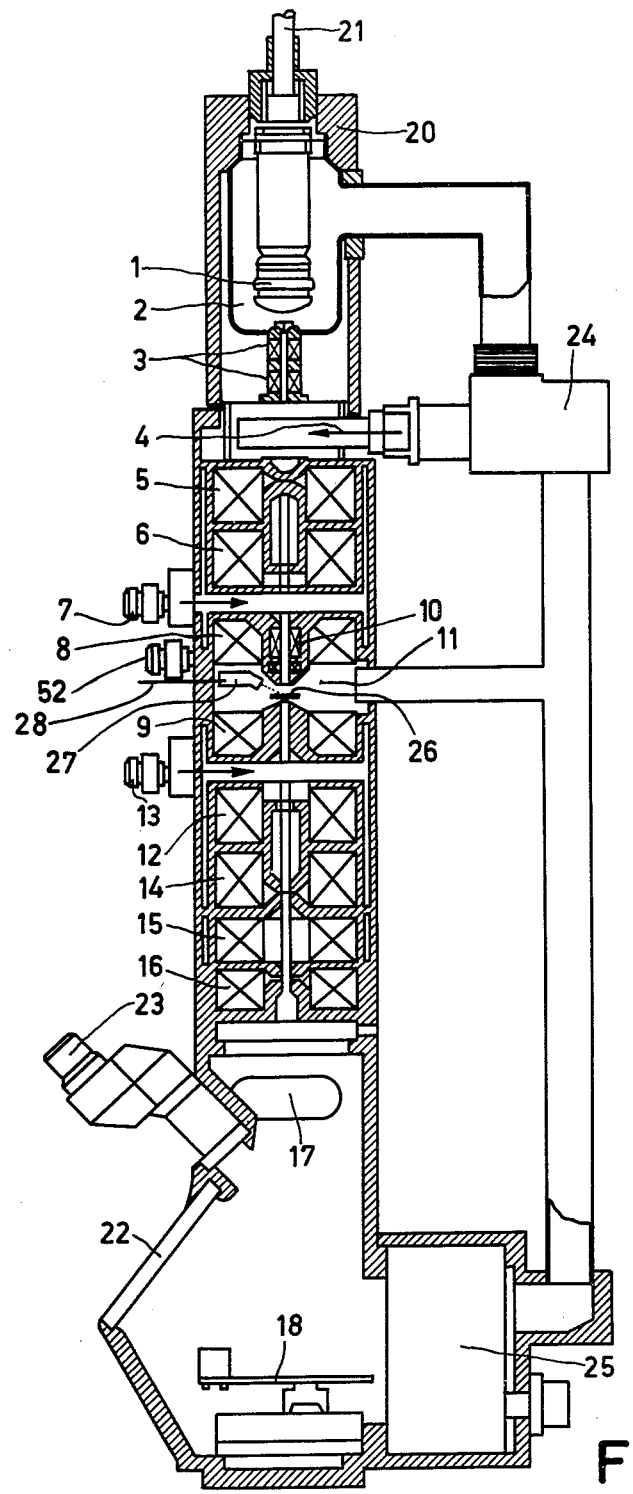

United States Patent [19]

Mariën et al.

[11] 4,450,355

[45] May 22, 1984

[54] ELECTRON MICROSCOPE COMPRISING AN X-RAY DETECTOR

[75] Inventors: Hendricus C. J. Mariën; Michael N. Thompson, both of Eindhoven, Netherlands

[73] Assignee: U.S. Philips Corporation, New York, N.Y.

[21] Appl. No.: 314,936

[22] Filed: Oct. 26, 1981

[30] Foreign Application Priority Data

Jan. 30, 1981 [NL] Netherlands .......................... 8100449

[51] Int. Cl.³ .................... G01N 23/225; H01J 37/256
[52] U.S. Cl. .................................................. 250/310
[58] Field of Search .................. 250/310, 397, 311

[56] References Cited

U.S. PATENT DOCUMENTS 3,359,418 12/1967 Bahr et al. ........................... 250/311

FOREIGN PATENT DOCUMENTS 5597 1/1977 Japan .................................... 250/310
1183571 3/1970 United Kingdom ................ 250/310

Primary Examiner—Alfred E. Smith
Assistant Examiner—Jack I. Berman
Attorney, Agent, or Firm—Paul R. Miller

[57] ABSTRACT

A detector for measuring X-rays in an electron microscope comprises a shield which shields a detector entrance window against the incidence of electrons or not in accordance with the various measuring settings. The shield may be arranged to be movable under the influence of the magnetic field strength variation which occurs during the switching over between the various measuring settings.

7 Claims, 2 Drawing Figures

ELECTRON MICROSCOPE COMPRISING AN X-RAY DETECTOR

The invention relates to an electron microscope comprising a detector which is arranged near an electromagnetic lens in order to detect radiation to be released from an object by an electron beam.

An electron microscope of this kind is known from GB No. 1,420,803. If a detector arranged in the vicinity of an objective lens is adapted to detect electromagnetic radiation emerging from the object, such as X-rays, like in such patent specification, secondary electrons emerging from the object or reflected electrons may have an adverse effect on the measurement or the detector in given measuring settings, for example, the low-magnification setting described in U.S. Pat. No. 3,629,575. For settings for magnifications within the customary range, such adverse effects are usually avoided because such electrons are then intercepted by the comparatively strong magnetic field of the relevant lens, so that they do not reach the detector. For optimum measurement it is then desirable that the detector is arranged as near to the object as possible and that it is highly sensitive to the radiation to be measured. However, it is exactly in this optimum position that the detector is susceptible to the interception of scattered electrons in a measuring setting with a weakly energized lens as used in such low-magnification setting.

The invention has for its object to mitigate this drawback; to this end, an electron microscope of the kind set forth is characterized in that the detector comprises an electron-absorbing shield which can be moved into and out of a path for the radiation to be measured by the detector.

Thus in an electron microscope in accordance with the invention, in the case of a lens which is not too weakly energized measurement can take place with an optimum position and construction of the detector, while in the case of a weakly energized lens, adverse effects on the detector due to incidence of electrons are prevented by the shield.

In a preferred embodiment in accordance with the invention, a switching mechanism for the shield is coupled to a control device for the energizing of the lenses, so that in reaction to any relevant change of the lens energizing the shield is automatically placed in the correct position; this can be realized, for example, by means of a computer associated with the electron microscope.

In a further preferred embodiment in accordance with the invention, the shield can be adjusted by the magnetic field of the lens itself. In the most common situation, the shield will then leave the access of radiation to the detector unobstructed in the case of a lens which is not too weakly energized, and in the case of a weakly energized lens it will shield the detector, but obviously the reverse situation is also within the scope of the invention. Similarly, the invention need not be restricted either to the actual objective lens for an electron microscope.

Figure 2:
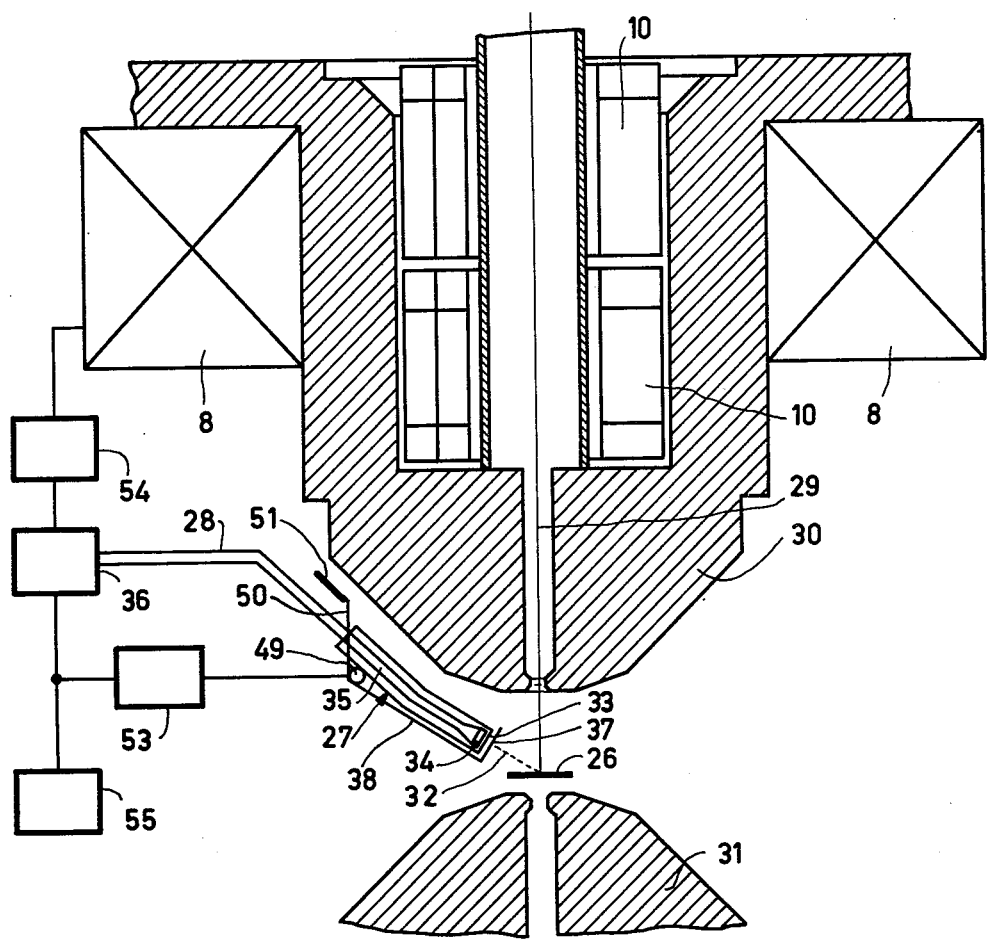

Some preferred embodiments in accordance with the invention will be described in detail hereinafter with reference to the drawing. Therein:

FIG. 1 shows an electron microscope comprising an adjustable detector in the vicinity of the objective lens in accordance with the invention, and FIG. 2 is a diagrammatic sectional view of the objective lens with a detector in accordance with the invention.

The electron microscope shown in FIG. 1 comprises an electron source 1 with an anode 2, a beam alignment system 3 and a diaphragm 4, a condenser system with a first condenser lens 5, a second condenser lens 6 and a condenser diaphragm 7, an objective with a first objective lens coil 8 and a second objective lens coil 9, a beam scanning system 10, an object space 11, a diffraction lens 12 with a diffraction diaphragm 13, an intermediate lens 14, a projection system with a first projection lens 15 and a second projection lens 16, a film camera 17, and a viewing screen 18. All these components are accommodated in a housing 20 which comprises an electrical power supply lead 21 for the electron source and also a viewing window 22. An optical viewer 23, a vacuum pumping device 24 and a plate camera 25 are connected to the housing. In the object space 11 there are situated an object 26 and a radiation detector 27 with a signal output line 28 for the detection of radiation to be released from the object by an electron beam 29.

FIG. 2 shows the detector 27 together with the object 26 and objective lens coils 30 and 31. The electron beam 29 is incident on the object 26 on which it can perform a scanning motion with the aid of the deflection coil system 10. Radiation released in the object can reach the detector along a path 32. For the measurement of, for example, X-rays, the detector comprises, arranged behind an entrance window 33, for example, a semiconductor detector which is cooled or not and which comprises a signal output line 35 which is connected to a signal processing device 36 by the lead 28. In front of the entrance window, being comparatively thin for the benefit of suitable radiation transmission and being made of, for example, beryllium, there is arranged a shield 37 which is in this case connected, by a first lever 38, to a pivot device 49 and to a second lever 50 on which a block 51 of a magnetic material is provided.

When the lens pole 30 is energized, the element 51 is attracted by the pole so that the shield 37 is moved out of the path 32. When the energizing is stopped, the shield returns to the shielding position. For the purpose of external control, which can also be realized manually by means of a switch 52, the pivot mechanism may be connected to a control block 53 which is also connected, by the signal processing device 36, to a power supply element 54 for the coil 8. As a result, the energizing of the coil and the movement of the shield can be simply synchronized, coupling to the signal processing system then also being possible. The embodiment comprising a shield which can be moved from the outside need not comprise the second lever 50 and the element 51. This embodiment is particularly suitable in cases where the magnetic field strength variation in a reasonably accessible space is insufficient for autonomous shield control. The shield movement activated by the magnetic field itself can also be realized, if necessary, so that shielding of the detector occurs when the coil is strongly energized. Suitable synchronization between measuring setting and shield position can also be achieved under the central control of a central computer 55 which customarily forms part of an electron microscope anyway.

What is claimed is:

1. An electron microscope comprising:
   at least one electromagnetic lens controlling an electron beam, an object receiving said electron beam and producing radiation, detector means adjacent to said object for measuring said radiation from said object, an electron absorbing shield movable into position between said object and said detector means, and means for moving said shield into and out of said position in accordance with energization of said electromagnetic lens, said shield being moved into said position at low energization of said electromagnetic lens and being moved out of said position at high energization of said electromagnetic lens.

2. An electron microscope according to claim 1, wherein said means for moving said shield include a control circuit for energizing said electromagnetic lens and a computer, said control circuit and said computer automatically moving said shield in relation to changes in said electromagnetic lens energization.

3. An electron microscope according to claim 1, wherein said means for moving said shield further include a lever having said shield attached at one end, a pivot attached at the other end of said lever, and means connecting said control circuit to said pivot for automatically moving said shield in response to said control circuit.

4. An electron microscope according to claim 1, wherein said means for moving said shield include magnetic means for moving said shield in accordance with the magnetic field strength of said electromagnetic lens.

5. An electron microscope according to claim 4, wherein said means for moving said shield further include a first lever having said shield attached at one end, a pivot attached at the other end of said first lever, a second lever having one end attached to said pivot, and magnetic material attached to the other end of said second lever, said magnetic material being attracted by said electromagnetic lens.

6. An electron microscope according to claim 1, wherein said means for moving said shield include a manually operated switching mechanism.

7. An electron microscope according to claim 1, wherein said means for moving said shield includes a central computer for control of the electron microscope.

* * * * *